United States Patent [19]
Shirley

[11] Patent Number: 5,883,849
[45] Date of Patent: Mar. 16, 1999

[54] METHOD AND APPARATUS FOR SIMULTANEOUS MEMORY SUBARRAY TESTING

[75] Inventor: Brian M. Shirley, Boise, Id.

[73] Assignee: Micron Technology, Inc., Boise, Id.

[21] Appl. No.: 885,535

[22] Filed: Jun. 30, 1997

[51] Int. Cl.[6] ...................................................... G11C 8/00
[52] U.S. Cl. ............................... 365/230.02; 365/189.02; 365/201; 365/230.03
[58] Field of Search .......................... 365/230.03, 189.01, 365/189.03, 203, 189.02, 230.02

[56] References Cited

U.S. PATENT DOCUMENTS

| | | | |
|---|---|---|---|
| 5,208,779 | 5/1993 | Walther et al. | 365/222 |
| 5,291,443 | 3/1994 | Lim | 365/189.04 |
| 5,335,201 | 8/1994 | Walther et al. | 365/222 |
| 5,335,202 | 8/1994 | Manning et al. | 365/222 |
| 5,390,149 | 2/1995 | Vogley et al. | 365/189.01 |
| 5,394,172 | 2/1995 | McLaury | 345/200 |
| 5,506,810 | 4/1996 | Runas | 365/230.03 |
| 5,594,474 | 1/1997 | McLaury | 345/203 |
| 5,617,555 | 4/1997 | Patel et al. | 365/230.03 |
| 5,627,791 | 5/1997 | Wright et al. | 365/222 |
| 5,749,086 | 5/1998 | Ryan | 365/189.03 |

*Primary Examiner*—David Nelms
*Assistant Examiner*—David Lam
*Attorney, Agent, or Firm*—Schwegman, Lundberg, Woessner & Kluth, P.A.

[57] ABSTRACT

One row of memory cells per sense amplifier bank on a multiple subarray dynamic random access memory (DRAM) are fired while in a test mode. Multiplexors are provided on local I/O lines to ensure that the local I/O lines are not connected to global I/O lines when multiple rows are fired. This provides protection for I/O circuitry not designed to handle the load of multiple local I/O lines coupled in parallel. The multiplexors are controlled by a multiplexor control signal which is separate from row and column decode signals. During a refresh/hammer test, such rows are fired as many times as possible during a refresh period. Then adjacent rows are tested to determine if they were affected by the firing. During the firing, the multiplexors effectively isolate global I/O lines from local I/O lines.

17 Claims, 2 Drawing Sheets

METHOD AND APPARATUS FOR SIMULTANEOUS MEMORY SUBARRAY TESTING

FIELD OF THE INVENTION

The present invention relates to testing of semiconductor based memory devices, and in particular to testing such memory devices having multiple subarrays.

BACKGROUND OF THE INVENTION

Semiconductor memory devices are becoming more and more complex as their size decreases and their storage density increases. To help handle some of the increase in storage density, an architecture comprising multiple subarrays of memory cells for storing values has been adopted in dynamic random access memory (DRAM) devices. Each of the subarrays comprises multiple columns and multiple rows of memory cells. Rows are accessed or "fired" by activation of row address signals. Each column of memory cells in a subarray is coupled to a sense amplifier which in turn is selectively coupled to pairs of I/O lines which are local to each subarray. Sense amplifiers may be coupled to columns of cells in more than one subarray. Multiplexors in gaps between subarrays are used to couple local I/O lines to pairs of global I/O lines, which provide the values for several of the subarrays.

During normal memory operation, the multiplexors are often controlled by a signal that is active only if a row has been fired in that subarray. There are multiple global I/O lines, each one providing data from multiple subarrays. The multiplexors allow only one cell to be coupled through a local I/O line to a global I/O line to prevent conflicting signals from occurring on the global I/O lines. Hence, the control of the multiplexors is tied closely to row decode signals.

This type of architecture has been very helpful in obtaining DRAMs beyond the 16 MB generation. However, as the storage capacity has increased, so have testing times. The same architecture that facilitates higher storage capacities, has also made it time consuming to test the DRAMs by limiting the number of rows that can be fired at any one time. In one type of row disturb test, a row is first written with data, and then accessed or fired and latched as many times as possible during a standard refresh cycle. This simulates a worst case condition to which a customer could subject the DRAM. It may result in rows adjacent to the fired row being affected by noise or leakage mechanisms between the rows. Following this type of test, other data cells, such as those in nearby rows are read to see if they have been affected by the row disturb. When the array comprises an eight by eight subarray arrangement, only the rows of a block of eight subarrays may be fired during this test. That means that the test must be repeated for each row in the subarrays multiplied by eight more subarrays. With 512 rows per subarray, the test is done 8096 times. The time taken just to fire the rows is then 8096 times the refresh rate. This type of testing is usually performed both at the wafer level, and at the final package level at least twice. The large amount of time to test the DRAM requires additional resources per DRAM which increases the cost of the DRAMs.

There is a need to cut down the time it takes to perform row disturb types of testing. There is a need to cut down such time without adding complex circuitry to the DRAM device, which could cut achievable densities. There is yet a further need to reduce the expense associated with testing of DRAM devices.

SUMMARY OF THE INVENTION

One row of memory cells per sense amplifier bank on a multiple subarray dynamic random access memory (DRAM) is fired while in a test mode. This is accomplished in one embodiment by simply ignoring selected portions of the row addresses that select the subarrays. Control circuitry is provided for the I/O multiplexors to ensure that the local I/O lines are not connected to global I/O lines when multiple rows are fired. This provides protection for I/O circuitry not designed to handle the load of multiple local I/O lines coupled in parallel. The multiplexors are controlled by a signal which is separate from row and column decode signals. In one embodiment, the signal is a test signal which is also operative to cause decoding circuitry to ignore the subarray selection portions of the address during test mode.

In a further embodiment, sense amplifiers are interleaved such that they are each used for sensing rows from two arrays. The decoding circuitry, in response to the test signal, ensures that only one row per sense amplifier is fired at any given time. During a refresh/hammer test, such rows are fired as many times as possible during a refresh period. Then adjacent rows are tested to determine if they were affected by the firing. During the firing, the multiplexors effectively isolate global I/O lines from local I/O lines. This is done to prevent summing of signals from the local I/O lines which might have unknown effects on the global I/O line.

By providing the ability to fire multiple row lines in multiple subarrays at the same time during testing, testing times are greatly reduced. This provides a less expensive testing cycle, and does so with little additional circuitry.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
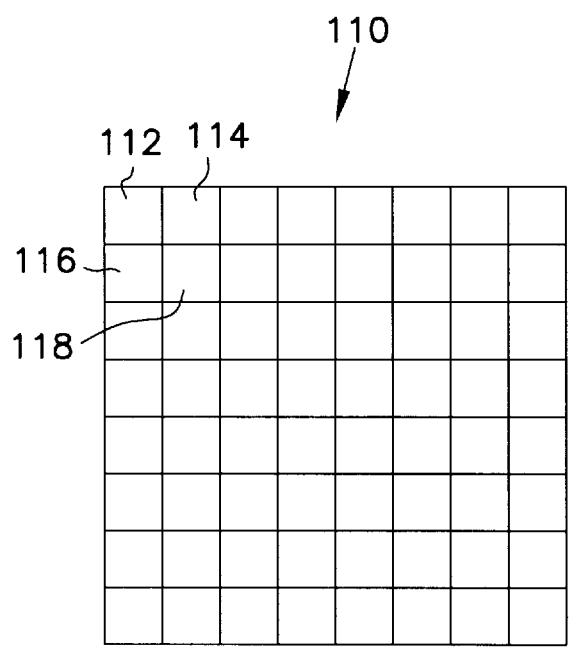
FIG. 1 is a high level block representation of a dynamic random access storage device having multiple subarrays of memory cells.

A dynamic random access memory device (DRAM) is shown generally at 110 in FIG. 1. DRAM 110 comprises multiple subarrays of memory cells, some of which are indicated at 112, 114, 116 and 118. In one embodiment, 64 subarrays, each having 512 rows and columns are used to form a 16 MB array. Four arrays are then combined to form a 64 MB DRAM. Further variations on the number of subarrays and arrays comprising DRAMs of various sizes are within the scope of the present invention.

Figure 2:
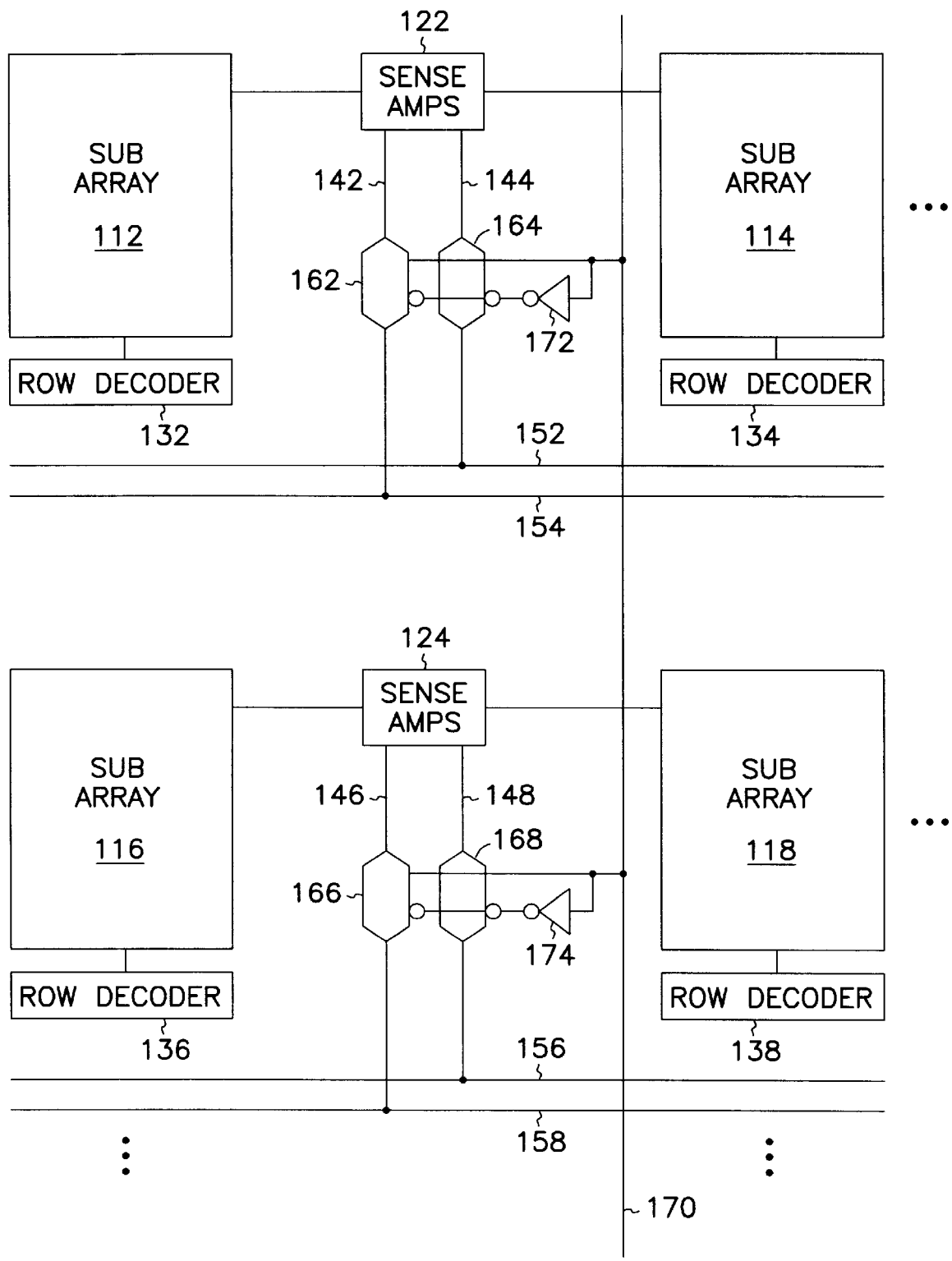
FIG. 2 is a partial block circuit diagram of selected subarrays of the dynamic random access memory of FIG. 1.

A portion of the DRAM 110 is shown in further detail in FIG. 2. Adjacent subarrays 112 and 114 share a bank of sense amplifiers 122. Adjacent subarrays 116 and 118 share a bank of sense amplifiers 124. The sense amplifiers are used to sense and amplify individual values stored in memory cells. Each column in a subarray is coupled to a sense amplifier in the bank of sense amplifiers 124. Each such sense amplifier is commonly coupled to a column of memory cells in an adjacent subarray. Memory cells are selected by firing individual rows of cells via a row decoder 132, 134, 136 and 138 corresponding to each subarray. The sensed and amplified values are provided by the sense amps on local pairs of I/O lines indicated at 142, 144, 146, and 148. The local I/O lines are then coupled to pairs of global I/O lines indicated at 152, 154, 156 and 158. Pairs of multiplexors 162, 164, 166 and 168 are coupled between the local I/O lines and the global I/O lines to selectively gate the signals from the local I/O lines to the global I/O lines under control of a multiplexor control signal on a line 170. In one embodiment, the multiplexors comprise pairs of parallel coupled n and p channel transistors, with the p channel transistors being fed the complement of the multiplexor control signal via invertors 172 and 174. Further methods of multiplexing the local I/O pairs will be apparent to those skilled in the art.

During normal operation of the memory 110, the decoders decode row addresses and cause only one row of memory cells out of all the rows in all the subarrays to be fired, and the multiplexor control signal to be in a state to couple the appropriate local I/O lines to the global I/O lines. It should be noted that the global I/O lines shown may be a single contiguous pair of lines, or may be further multiplexed together at a point not shown.

During testing operations, it is desired to fire a row in multiple subarrays at the same time or substantially simultaneously to save testing time. It should be noted that the term simultaneously is used to indicate that there is at least some overlap in the time during which multiple rows are fired. They need not be precisely fired at the same time. In fact, given path length differences, it would be difficult to precisely synchronize them. To do this, the decoders are directed to ignore most of a row address related to selection of the subarray. Each decoder still does some decoding based on the subarray address to ensure that only a row in one of two adjacent subarrays sharing a bank of sense amplifiers is fired at any one time if such sense amplifiers cannot be used at the same time without conflict. It should be noted that local decoders are shown, but a central decoder could also be used.

In a refresh/hammer test, 32 rows in the 64 subarray array are fired at the same time, with the multiplexors preventing coupling to the global I/O lines. Each of the 32 rows is fired, and sensed and amplified by associated sense amplifiers as many times as possible during a single refresh cycle to stress the memory as much as possible. Following this stressing, adjacent rows are sensed to see if they were affected.

The multiplexor control signal is independent of any subarray or sense amp control signal. It may be provided on line 170 by an external testing device during testing and otherwise coupled to allow normal operation of the I/O lines during normal operation. When the testing described above is performed, the multiplexor control signal 170 controls the multiplexors 162, 164, 166 and 168 to isolate the local control lines 142, 144, 146 and 148 from the global control lines 152, 154, 156 and 158. This ensures that the global control lines are not stressed beyond capacity and that no parasitic effects occur. Separating the multiplexor control signal from any subarray or sense amp control signals allows much faster testing of the memory 110. It permits the simultaneous firing of rows of memory cells in multiple subarrays, which in the past had to be fired independently. This results in tremendous savings in time in refresh/ hammer tests, which are conducted several times in the manufacturing of DRAM memory.

It is to be understood that the above description is intended to be illustrative, and not restrictive. Many other embodiments will be apparent to those of skill in the art upon reviewing the above description. For example, while the multiplexor control signal is shown as being provided on a single line for all multiplexors, it could easily be a separate signal for each pair of multiplexors. Similarly, other types of multiplexors will work with the present invention. Further, separate banks of sense amps could be provided for each subarray, and the sizes and numbers of subarrays can be varied without departing from the invention. Still further, firing of selected rows could be performed without the decoder having to ignore portions of row addresses.

What is claimed is:

1. A memory array, comprising:

plural subarrays each having multiple rows of memory elements and local I/O lines;

a plurality of multiplexers coupled to the local I/O lines; and at least one global I/O line coupled to the multiplexers wherein the multiplexers isolate all of the local I/O lines simultaneously from the global I/O lines when multiple rows are substantially simultaneously fired.

2. The memory array of claim 1 wherein each subarray is coupled to a bank of sense amplifiers for sensing and amplifying values stored in the memory elements and wherein the sense amplifiers are coupled to the local I/O lines for providing the sensed values thereon.

3. The memory array of claim 2 wherein a bank of sense amplifiers is coupled to adjacent subarrays, and wherein only one row from one of the adjacent subarrays is fired at any given time.

4. The memory array of claim 1 and further comprising at least one row address decoder for selecting one row from multiple subarrays to be substantially simultaneously fired.

5. The memory array of claim 4 wherein the multiplexers are coupled to a multiplexer control signal which is independent of subarray selection.

6. A memory array, comprising:

plural subarrays each having multiple rows of memory elements;

a decoder for selecting subarrays and rows within subarrays;

a plurality of banks of sense amplifiers for sensing and amplifying values stored in the memory elements;

a plurality of local I/O lines coupled to the sense amplifiers;

a plurality of multiplexers coupled to the local I/O lines; and at least one global I/O line coupled to the multiplexers wherein the multiplexers isolate all of the local I/O lines simultaneously from the global I/O lines when rows in multiple arrays are substantially simultaneously fired.

7. The memory array of claim 6 wherein a bank of sense amplifiers is coupled to adjacent subarrays, and wherein only one row from one of the adjacent subarrays is fired at any given time.

8. The memory array of claim 7 wherein the multiplexers are coupled to a multiplexer control signal which is independent of subarray selection and sense amplifier selection.

9. A dynamic random access memory array, comprising:

multiple subarrays each having multiple rows of memory elements;

a decoder for selecting subarrays and rows within subarrays;

a plurality of banks of sense amplifiers, each sense amplifier being coupled to a memory element in one row from each of two adjacent subarrays that sense and amplify values stored in the memory elements;

a plurality of local I/O lines coupled to the sense amplifiers;

a plurality of multiplexers coupled to the local I/O lines;

at least one global I/O line coupled to the multiplexers; and a multiplexer control line which is independent of subarray selection signals, the multiplexer control line controlling the multiplexers to isolate all of the local I/O lines simultaneously from the global I/O lines when multiple rows are fired.

10. The memory array of claim 9 wherein the decoder selects only one row from one of the adjacent subarrays at any given time.

11. The memory array of claim 9 wherein each subarray comprises 512 rows with 512 memory elements in each row, and wherein the memory array comprises four sets of 64 subarrays.

12. A method of testing a memory array comprised of a plurality of subarrays having multiple rows of memory elements for storing values and local I/O lines coupled to global I/O lines, the method comprising the steps of:

firing single rows of memory cells in multiple subarrays at the same time;

sensing and amplifying the values stored in the memory cells;

providing the values on the local I/O lines; and isolating all of the local I/O lines simultaneously from the global I/O lines.

13. The method of claim 12 wherein the isolating step is performed by a multiplexer operating independently from selection of a subarray.

14. A method of testing a memory array comprised of a plurality of subarrays having multiple rows of memory elements for storing values and local I/O lines coupled to global I/O lines, the method comprising the steps of:

selecting single rows of memory cells in multiple subarrays such that no two rows share a sense amplifier;

firing the selected rows substantially simultaneously;

sensing and amplifying the values stored in the memory cells;

providing the values on the local I/O lines; and isolating all of the local I/O lines simultaneously from the global I/O lines independently from selection of the subarrays.

15. A method of testing a dynamic random access memory array comprised of a plurality of subarrays having multiple rows of memory elements for storing values and local I/O lines coupled to global I/O lines, the method comprising the steps of:

selecting single rows of memory cells in multiple subarrays such that no two memory cells in the selected rows share a sense amplifier;

continuously firing the selected rows substantially simultaneously for a predetermined period of time;

sensing and amplifying the values stored in the memory cells each time the selected rows are fired;

providing the values on the local I/O lines; and isolating all of the local I/O lines simultaneously from the global I/O lines independently from selection of the subarrays.

16. A method of testing a dynamic random access memory array comprised of a plurality of subarrays having multiple rows of memory elements for storing values and local I/O lines coupled to global I/O lines, the method comprising the steps of:

selecting single rows of memory cells in multiple subarrays such that no two memory cells in the selected rows share a sense amplifier;

continuously firing the selected rows substantially simultaneously during a predetermined period of time corresponding to a refresh period;

sensing and amplifying the values stored in the memory cells each time the selected rows are fired;

providing the values on the local I/O lines;

isolating all of the local I/O lines simultaneously from the global I/O lines independently from selection of the subarrays; and sensing values in memory cells in rows adjacent to the rows that were fired.

17. A memory array, comprising:

plural subarrays each having multiple rows of memory elements, each row being selected by a row selection signal, and having local I/O lines;

a plurality of multiplexers coupled to the local I/O lines;

a multiplexer control line having a multiplexer control signal which is independent of individual row selection signals; and at least one global I/O line coupled to the multiplexers wherein the multiplexers isolate all of the local I/O lines simultaneously from the global I/O lines when multiple rows are substantially simultaneously fired in response to the multiplexer control signal.

* * * * *